(12) United States Patent
Pan et al.

(10) Patent No.: US 7,994,419 B2
(45) Date of Patent: Aug. 9, 2011

(54) METHODS FOR FABRICATING THIN FILM III-V COMPOUND SOLAR CELL

(75) Inventors: Noren Pan, Wilmette, IL (US); Glen Hillier, Spring Grove, IL (US); Duy Phach Vu, San Jose, CA (US); Rao Tatavarti, Des Plaines, IL (US); Christopher Youtsey, Libertyville, IL (US); David McCallum, West Chicago, IL (US); Genevieve Martin, Chicago, IL (US)

(73) Assignee: MicroLink Devices, Inc., Niles, IL (US)

( * ) Notice: Subject to any disclaimer, the term of this patent is extended or adjusted under 35 U.S.C. 154(b) by 237 days.

(21) Appl. No.: 12/167,583

(22) Filed: Jul. 3, 2008

(65) Prior Publication Data

US 2009/0044860 A1 Feb. 19, 2009

Related U.S. Application Data

(60) Provisional application No. 60/958,186, filed on Jul. 3, 2007, provisional application No. 61/045,850, filed on Apr. 17, 2008.

(51) Int. Cl.
*H01L 31/0256* (2006.01)

(52) U.S. Cl. ......... 136/255; 438/74; 136/257; 136/262; 136/261

(58) Field of Classification Search .......... 136/252, 136/255, 262; 438/74
See application file for complete search history.

(56) References Cited

U.S. PATENT DOCUMENTS

| 5,458,694 A | * | 10/1995 | Nuyen ........................ 136/249 |
| 6,946,309 B2 | | 9/2005 | Camras et al. |
| 6,974,521 B2 | | 12/2005 | Schermer |
| 7,488,890 B2 | | 2/2009 | Takamoto et al. |
| 2003/0047289 A1 | | 3/2003 | Jaussaud et al. |
| 2004/0118451 A1 | * | 6/2004 | Walukiewicz et al. ........ 136/262 |
| 2004/0206389 A1 | * | 10/2004 | Takamoto et al. ............ 136/255 |
| 2006/0054900 A1 | * | 3/2006 | Takamoto et al. ............. 257/80 |

OTHER PUBLICATIONS

J.J. Schermer et al., "Epitaxial Lift-Off for Large Area Thin Film III/V Devices," Phys. Stat. Sol. (a) vol. 202, No. 4, 501-508, 2005.
J.J. Schermer et al., "High Rate Epitaxial Lift-Off of InGaP Films from GaAs Substrates," Appl. Phys. Lett, vol. 6, No. 15, 2131-2133, Apr. 10, 2000.
E. Yablonovitch, "Ultra-Efficient Epitaxial Liftoff Solar Cells Exploiting Optical Confinement in the Wave Limit," Final Technical Report, NREL/SR-520-26903, Nov. 1999.

(Continued)

*Primary Examiner* — Jennifer K. Michener
*Assistant Examiner* — Magali P Slawski
(74) *Attorney, Agent, or Firm* — McCarter & English LLP

(57) ABSTRACT

The present invention utilizes epitaxial lift-off in which a sacrificial layer is included in the epitaxial growth between the substrate and a thin film III-V compound solar cell. To provide support for the thin film III-V compound solar cell in absence of the substrate, a backing layer is applied to a surface of the thin film III-V compound solar cell before it is separated from the substrate. To separate the thin film III-V compound solar cell from the substrate, the sacrificial layer is removed as part of the epitaxial lift-off. Once the substrate is separated from the thin film III-V compound solar cell, the substrate may then be reused in the formation of another thin film III-V compound solar cell.

8 Claims, 9 Drawing Sheets

OTHER PUBLICATIONS

A. van Geelen et al., "Epitaxial Lift-Off GaAs Solar Cell From a Reusable GaAs Substrate," Materials Science & Engineering, B45, pp. 162-171, 1997.

T. Takamoto et al., "Paper-Thin InGaP/GaAs Solar Cells," Photovoltaic Energy Conversion, Conference Record of the 2006 IEEE 4th World Conference, pp. 1769-1772, May 2006.

J.F. Geisz et al., "High-Efficiency GaInP/GaAs/InGaAs Triple-Junction Solar Cells Grown Inverted With a Metamorphic Bottom Junction," Appl. Phys. Lett., vol. 91, 023502, Jul. 10, 2007.

D.C. Law et al., Solar Energy Materials & Solar Cells 2008, doi:10.1016/j.solmat.2008.07.014.

A. Fontcuberta I Morral et al., "InGaAs/InP Double HeteroStructures on InP/Si Templates Fabricated by Wafer Bonding and Hydrogen-Induced Exfoliation," vol. 83, No. 26, p. 5413-5415, Dec. 29, 2003.

International Search Report for Application No. PCT/US08/08263, dated Sep. 19, 2008.

International Search Report for Application No. PCT/US08/08262, dated Sep. 12, 2008.

Written Opinion for Application No. PCT/US08/08262, dated Sep. 12, 2008.

International Preliminary Report on Patentability for Application No. PCT/US08/08262, dated Jan. 5, 2010.

Written Opinion for Application No. PCT/US08/08263, dated Sep. 12, 2008.

International Preliminary Report on Patentability for Application No. PCT/US08/08263, dated Jan. 5, 2010.

Office Action issued in Chinese Application No. 200880101271.9, dated Apr. 13, 2011.

Katsuaki Tanabe et al., "Direct-Bonded GaAs/InGaAs Tandem Solar Cell," Applied Physics Letters, vol. 89, pp. 102106-1-102106-3, Sep. 6, 2006.

* cited by examiner

METHODS FOR FABRICATING THIN FILM III-V COMPOUND SOLAR CELL

RELATED APPLICATION

This application claims priority to Provisional Application No. 60/958,186 filed on Jul. 3, 2007, and to Provisional Application No. 61/045,850 filed on Apr. 17, 2008, both of which are herein incorporated by reference in their entirety.

STATEMENT OF GOVERNMENT SUPPORT

Some of the work described herein was sponsored by the National Renewable Energy Laboratory (NREL), Contract No. NAT-7-77015-05. The U.S. Government has certain rights in the invention.

TECHNICAL FIELD

The present invention concerns photovoltaic devices. More specifically, the present invention concerns III-V compound based photovoltaic devices and epitaxial lift-off methodologies in the fabrication of III-V compound based photovoltaic devices.

BACKGROUND

Currently, III-V compound based photovoltaic devices are epitaxially grown on substrates and remain affixed thereto throughout fabrication and deployment as a solar cell. In many cases, the substrates can be approximately 150 μm thick. Having substrates with such thickness may introduce a number of undesirable consequences for a solar cell.

One such undesirable consequence is weight. The thick substrate can make up a large percentage of the overall weight of the resulting solar cell. In certain applications, such as space applications, weight and size of a solar cell can be significant given the liftoff capability of the selected launch vehicle.

Another undesirable consequence is poor thermal conductivity. The substrate increases the thermal impedance between the solar cell and a heat sink on which the substrate and solar cell may be mounted. The increased thermal impedance results in higher junction temperatures in the solar cell, which, in turn, reduces the efficiency of the solar cell.

Another undesirable consequence is environmental impact. The substrate serves no purpose other than as a mechanical support for the solar cell. In addition, to achieve a substrate thickness of approximately 150 μm, it is typically necessary to remove, mechanically or chemically, part of the substrate, which amounts to further waste.

Another undesirable consequence is lack of flexibility. A 150 μm thick substrate is rigid, which means that the solar cell cannot be mounted on a curved surface and cannot be rolled up for easy storage.

Although, it is desirable that the substrate of a solar cell be as thin as possible to reduce the weight and to increase the thermal conductivity, thin substrates can also present undesirable difficulties. If the substrate is too thin, the III-V compound solar cell can become so fragile that it is very difficult to handle. For example, a layer of Gallium Arsenide (GaAs) that is 100 mm in diameter, but only 2-10 μm thick, tends to crack and break when subjected to even very gentle handling. This consideration applies particularly to whole wafers of III-V compound solar cells. That is, the thinner the substrate, the more difficult it becomes to fabricate whole wafers of III-V compound solar cells without a decrease in yield due to breakage and handling damage.

Accordingly, a thin film III-V compound solar cell and methodologies for fabrication of thin film III-V compound solar cells that utilizes a removable and reusable substrate in the fabrication process is desirable.

SUMMARY

The present invention teaches different structures for thin film III-V compound solar cells free of a substrate and methodologies for fabrication of the same. As taught herein, one or more thin film III-V compound solar cells are epitaxially grown on a sacrificial layer formed on a substrate. In turn, the one or more thin film III-V compound solar cells are separated from the substrate by an epitaxial lift-off technique. To provide support for the thin film III-V compound solar cell in absence of the substrate, a metallized layer, polymer layer, or metal/polymer layer is applied to the thin film III-V compound solar cell before the thin film III-V compound solar cell is separated or lifted from the substrate. To separate the thin film III-V compound solar cell from the substrate, the sacrificial layer is removed. The metallized layer, polymer layer, or metal/polymer layer allows the thin film III-V compound solar cell to flex without being damaged. The fabrication methodologies taught herein are particularly useful for large-scale fabrication and lift off of thin film III-V solar cells. That is, the fabrication methodologies taught herein are well suited to lift off large area wafers up to 6-inch diameter, which is the largest diameter available for GaAs wafers. Liftoff has been performed on wafers up to 6 inches in diameter.

In accordance with fabrication methodologies taught herein, a comparison of the Current v. Bias (IV) characteristics of a resulting thin film III-V compound solar cell with the Current v. Bias (IV) characteristics a conventional III-V compound solar cell having a substrate attached thereto revealed little, if any, difference between the IV characteristics of the two solar cells. However, the thin film III-V compound solar cell fabricated in accordance with the teachings herein advantageously did not suffer from the undesirable thermal and weight limitations associated with the solar cell having the substrate attached thereto. In addition, once the substrate was separated from the thin film III-V compound solar cell, the substrate was reused in the fabrication of another thin film III-V compound solar cell.

In accordance with one embodiment, a method is provided for fabrication of a thin film III-V compound solar cell. The method involves providing a substrate. A sacrificial layer is formed on the substrate. A thin film III-V compound solar cell having a single junction is then formed on the sacrificial layer. A backing layer is then formed on the thin film III-V compound solar cell. Once the backing layer is formed, the sacrificial layer is removed from between the thin film III-V compound solar cell and the substrate to separate the thin film III-V compound solar cell from the substrate.

In accordance with another embodiment of the present invention, a method is provided for forming a multi-junction thin film III-V compound solar cell. The method involves providing a substrate. A sacrificial layer is formed on the substrate. A first III-V compound solar cell junction is formed on the sacrificial layer. A second III-V compound solar cell junction is formed on the first solar cell junction. A backing layer is formed on the second III-V compound solar cell junction. Once the backing layer is formed, the sacrificial layer is removed from between the first solar cell junction and the substrate to separate the multi-junction thin film III-V compound solar cell from the substrate.

In accordance with another embodiment, a method is provided for forming a thin film III-V compound solar cell. The method involves providing a substrate that was previously used in the fabrication of a III-V compound solar cell. A sacrificial layer is formed on the substrate. The thin film III-V compound solar cell is formed on the sacrificial layer. A backing layer is formed the thin film III-V compound solar cell. Once the backing layer is formed, the sacrificial layer may be removed from between the thin film III-V compound solar cell and the substrate to separate the thin film III-V compound solar cell from the substrate.

In accordance with another embodiment, a method for forming a plurality of thin film III-V compound solar cells is disclosed. The method includes providing a substrate, forming a sacrificial layer on the substrate, forming a full wafer-sized III-V compound solar cell on the sacrificial layer and removing the sacrificial layer from between the wafer-sized solar cell and the substrate to separate the wafer-sized III-V compound solar cell from the substrate on a wafer sized scale.

In another embodiment, a method for forming a flexible III-V compound solar cell is disclosed. The method includes receiving a substrate previously used to form a III-V compound solar cell, forming a sacrificial layer on the reused substrate, forming a wafer-sized flexible III-V compound solar cell on the sacrificial layer, forming a backing layer on the solar cell and removing the sacrificial layer from between the solar cell and the substrate to separate the wafer-sized solar cell from the substrate on a wafer sized scale.

In accordance with one embodiment, a method for forming a thin film multiple junction III-V compound solar cell is disclosed. The method includes the steps of forming a first thin film III-V compound solar cell on a first substrate and forming a second thin film III-V compound solar cell on a second substrate. The method includes the steps of removing by epitaxial lift off one of the first thin film III-V compound solar cell from the first substrate or the second thin film III-V compound solar cell from the second substrate, wafer bonding the first and the second thin film III-V compound solar cell to form a wafer bonded thin film multiple junction III-V compound solar cell and removing by epitaxial lift off the wafer bonded thin film III-V compound solar cell from the remaining substrate.

In another embodiment, a thin film III-V compound solar cell free of a substrate is disclosed. The thin film III-V compound solar cell includes an active layer and a backing layer formed on the active layer. The thin film III-V compound solar cell is initially formed on a substrate and the substrate is subsequently removed to leave the thin film III-V compound solar cell free of the substrate.

In one embodiment, a thin film III-V compound solar cell free of a substrate is disclosed. The thin film III-V compound solar cell includes a plurality of active layers and a backing layer formed on a surface of the active layer having the lowest bandgap energy level. The thin film III-V compound solar cell is formed on a substrate and the substrate is subsequently removed to leave the thin film III-V compound solar cell free of the substrate.

In another embodiment, another thin film III-V compound solar cell free of a substrate is disclosed. The thin film III-V compound solar cell includes a GaAs active layer and a GaInP active layer. The thin film III-V compound solar cell is formed on a substrate and the substrate is subsequently removed to leave the thin film III-V compound solar cell free of the substrate.

In one embodiment, another thin film III-V compound solar cell free of a substrate is disclosed. The thin film III-V compound solar cell includes a GaInAs active layer and a GaInAsP active layer. The thin film III-V compound solar cell is formed on a substrate and the substrate is subsequently removed to leave the thin film III-V compound solar cell free of the substrate.

In another embodiment, a wafer bonded thin film III-V compound solar cell free of a substrate is disclosed. The thin film III-V compound solar cell includes a GaInAs active layer, a GaInAsP active layer, a GaAs active layer, an AlGaInP active layer, a GaInP active layer, an AlGaInP active layer and a backing layer. The wafer bonded thin film III-V compound solar cell is formed on a substrate and the substrate is subsequently removed to leave the wafer bonded thin film III-V compound solar cell free of the substrate.

BRIEF DESCRIPTION OF THE FIGURES

These and other characteristics of the present invention will be more fully understood by reference to the following detailed description in conjunction with the attached drawings, in which.

DESCRIPTION

The present invention discloses thin film III-V compound solar cells and methodologies for fabricating such solar cell devices. The thin film III-V compound solar cells as taught herein are free of a substrate once fabrication is complete. During fabrication an epitaxial lift-off method is used which allows a thin film III-V compound solar cell to be separated from the substrate. A metallized layer, polymer layer, or metal/polymer layer formed on a surface of an active layer of the thin film III-V compound solar cell provides structural support in the absence of the substrate. The resulting thin film III-V compound solar cell is thinner, lighter, and more flexible than substrate supported solar cell devices (i.e., conventional solar cells) allowing for larger size, such as wafer scale components and wafer scale lift-off of thin film III-V compound solar cells. In addition, after separation from the photovoltaic device, the substrate can be reused with appropriate repolishing to restore the surface condition in the fabrication of another thin film III-V compound solar cell device.

Figure 1:
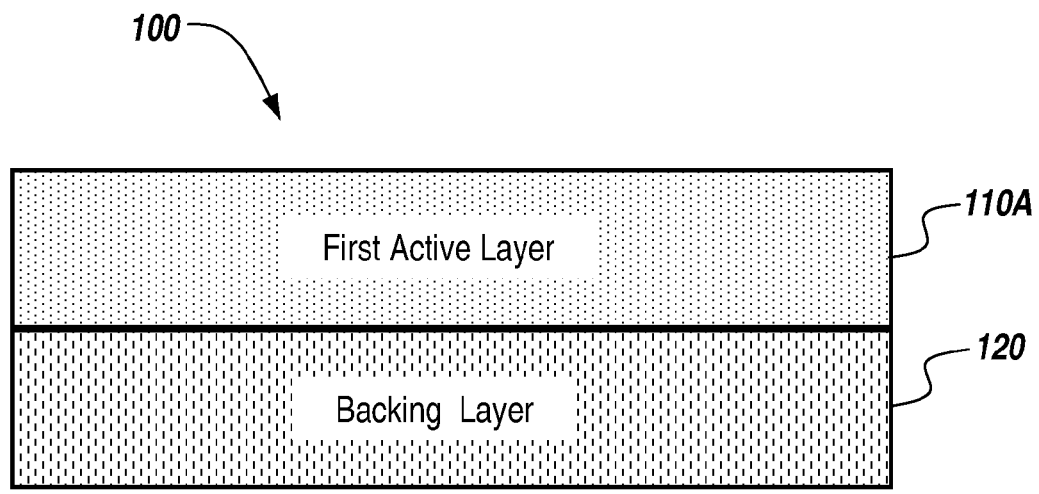
FIG. 1 is a cross-sectional view of an exemplary stack up of a thin film III-V compound solar cell having a structure in accordance with the teachings of the present invention.

FIG. 1 depicts an exemplary thin film III-V compound solar cell device 100 as taught by the present invention. The thin film III-V compound solar cell 100 includes an active layer 110A and a backing layer 120 formed on a first surface of the active layer 110A. The thin film III-V compound solar cell 100 may include additional metallization, an antireflection coating and other like features as discuss below. To facilitate explanation of the thin film III-V compound solar cell 100, one active layer (i.e., single junction) is used for illustrative purposes. As taught herein, the thin film III-V compound solar cells and the methods of fabricating the same, may involve thin film III-V compound solar cells with one active layer, two active layers, three active layers, four active layers or any suitable number of active layers (i.e., single junction and multiple junction thin film III-V compound solar cells).

As used herein, the term "active layer" refers to a layer or region of a thin film III-V compound solar cell having a certain band gap energy characteristic, which uses a certain portion of the solar spectrum to generate electricity. As used herein, each active layer in a multiple junction solar cell device has a different band gap energy characteristic.

As used herein, the reference designation 110A refers generically to a first active layer of a thin film III-V compound solar cell and does not imply or expressly teach that each first active layer discussed and depicted has the same structure, doping, III-V compound composition, performance, thickness and the like.

As used herein, the reference designation 110B refers generically to a second active layer of a thin film III-V compound solar cell and does not imply or expressly teach that each second active layer discussed and depicted has the same structure, doping, III-V compound composition, performance, thickness and the like.

As used herein, the reference designation 110C refers generically to a third active layer of a thin film III-V compound solar cell and does not imply or expressly teach that each third active layer discussed and depicted has the same structure, doping, III-V compound composition, performance, thickness and the like.

As used herein, the reference designation 110D refers generically to a fourth active layer of a thin film III-V compound solar cell and does not imply or expressly teach that each fourth active layer discussed and depicted has the same structure, doping, III-V compound composition, performance, thickness and the like.

The first active layer 110A of the thin film III-V compound solar cell 100 is formed of one or more III-V compounds. In certain embodiments, the first active layer 110A is formed of Gallium Arsenide (GaAs), Gallium Indium Phosphide (GaInP), Gallium Indium Arsenide (GaInAs), Gallium Indium Arsenide Phosphide (GaInAsP), or any other suitable III-V compound. The thin film III-V compound solar cell 100 may have more than one active layer. In certain embodiments, the active layer may include multiple sub-layers.

The backing layer 120 may be formed of a metal, a polymer, or a composite of metal and polymer. The backing layer 120 provides support for the first active layer 110A when the thin film III-V compound solar cell 100 is separated from a substrate 400 during and after epitaxial lift off (ELO).

Figure 4A:
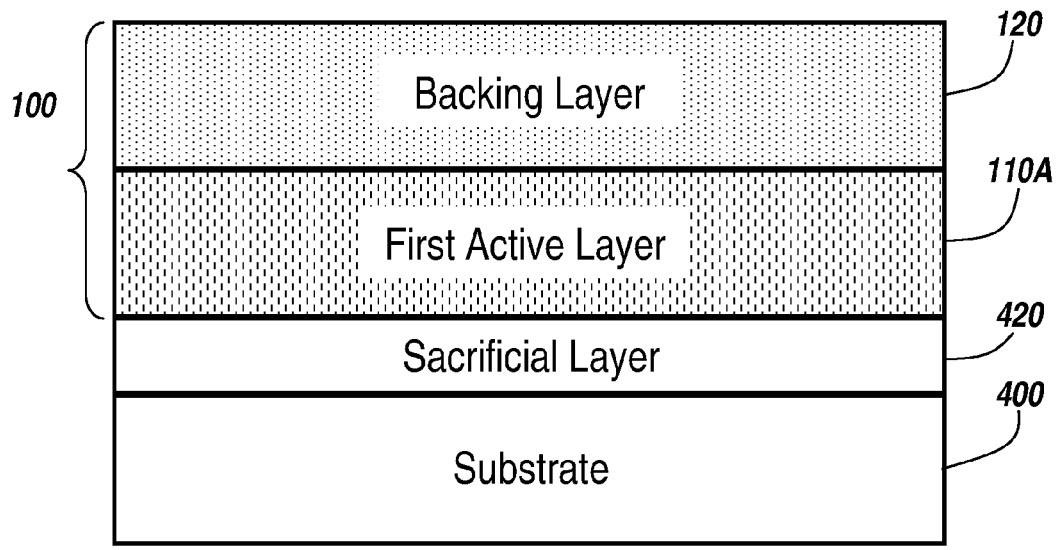
FIG. 4A depicts the thin film III-V solar cell of FIG. 1 before ELO.

The substrate 400 serves as a base providing a suitable lattice structure onto which the thin film III-V solar cell 100 is formed. FIG. 4A illustrates one example of the substrate 400. The substrate 400 may formed from Gallium Arsenide (GaAs), Indium Phosphide (InP), Gallium Phosphide (GaP), Gallium Antimonide (GaSb) or any other suitable III-V compound. As is taught herein, the substrate 400 can be recycled and reused to form another thin film III-V compound solar cell.

Figure 2:
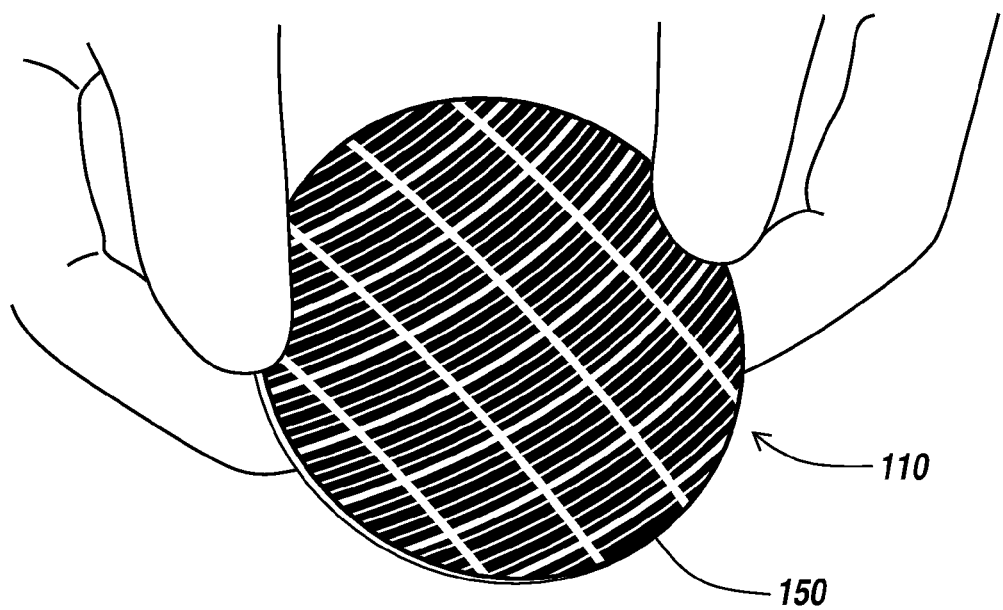
FIG. 2 is a perspective view of an exemplary array of thin film III-V compound solar cells formed on a wafer in accordance the teachings of the present invention.

FIG. 2 depicts an array 110 of thin film III-V solar cells formed on a wafer 150 using the methodologies taught by the present invention. For efficiency and economy an array 110 of thin film III-V compound solar cells as disclosed herein, are often fabricated on a wafer 150. One of the advantages of the methodologies taught by the present invention is that an entire wafer of a thin film III-V compound solar cell may be lifted from the substrate 400 and further processed to form the array 110 without increasing the risk of damaging the structure of the thin film II-V compound solar cell due to handling. Thus an array 110 of the thin film III-V compound solar cells may be formed after the epitaxial lift off process disclosed herein. As can be seen in this example, the thin film III-V compound solar cell fabricated in accordance with the teachings herein are flexible once lifted off the substrate 400.

Figure 3:
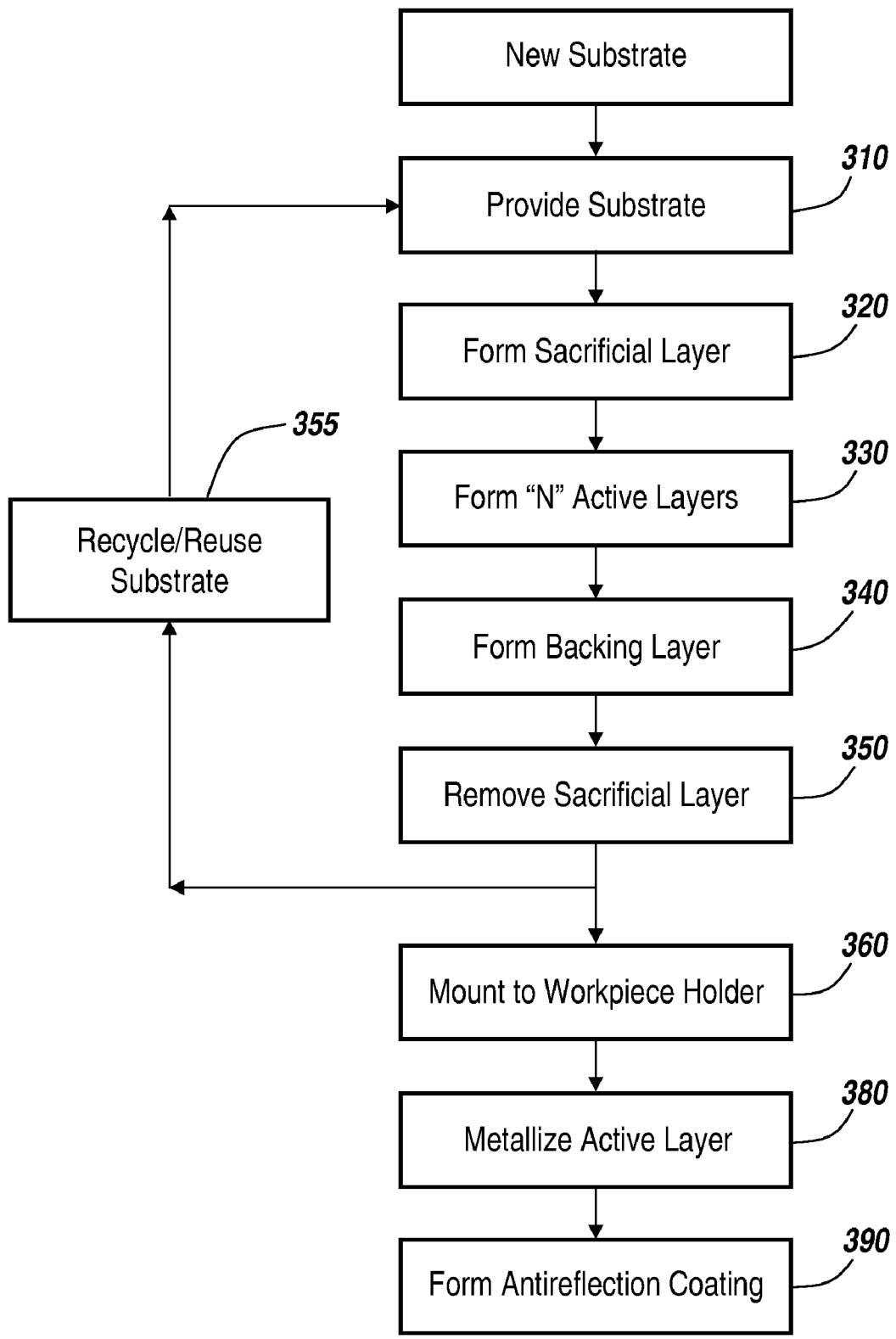
FIG. 3 is a flow diagram depicting steps taken to fabricate a thin film III-V compound solar cell using epitaxial lift-off (ELO) in accordance with the teachings of the present invention.

FIG. 3 is a block flow diagram of an exemplary method for fabricating thin film III-V solar cells in accordance with the teachings of the present invention. Those skilled in the art will appreciate that to facilitate explanation of one exemplary fabrication methodology one thin film III-V solar cell is discussed. Nonetheless, the fabrication methodology is equally applicable to a thin film III-V solar cell that may have one or more active layers. FIG. 3 is discussed in relation to FIGS. 4A and 4B, which depict exemplary stages in the fabrication of the thin film III-V compound solar cell 100.

The fabrication methodology of the thin film III-V compound solar cell 100 as taught herein involves growing epitaxial layers on a provided substrate. In step 310, the substrate 400 is provided. The substrate 400 may be a new substrate or may be a substrate that was previously used to fabricate on or more thin film III-V compound solar cells. That is, as is explained below, the substrate 400 is separated from the thin film III-V compound solar cell 100 at some point in the fabrication process and may be recycled and reused to fabricate another thin film III-V solar cell.

In step 320, a sacrificial layer 420 is formed on the substrate 400. The sacrificial layer 420 is formed on the substrate 400 using a Metal-Organic Chemical Vapor Deposition (MOCVD) methodology, a Molecular Beam Epitaxy (MBE) methodology or any other suitable methodology for forming an epitaxial layer. In some embodiments, the sacrificial layer 420 is lattice matched to the substrate 400. In other embodiments, pseudomorphic or mismatched lattice structures may be implemented. In such embodiments, a buffer layer may be used to facilitate growth of mismatched lattice structures. The sacrificial layer could be placed directly on top of the buffer layer, which would permit the removal of the buffer layer along with the substrate in the liftoff process.

The sacrificial layer 420 is formed of a material that can be removed using a process such as an epitaxial lift-off (ELO) process. In some embodiments, the sacrificial layer 420 is formed of Aluminum Gallium Arsenide (e.g., $Al_xGa_{1-x}As$ where x>80%) that is n-type or p-type doped. In some embodiments, the sacrificial layer 420 is formed of Indium Aluminum Arsenide (e.g., $In_{0.52}Al_{0.48}As$) that is n-type or p-type doped. In some embodiments, the sacrificial layer 420 is formed of Aluminum Arsenide Antimonide (e.g., $AlAs_{0.5}Sb_{0.5}$) that is n-type or p-type doped, or any other suitable III-V compound. In some embodiments, the sacrificial layer 420 is formed of Aluminum Phosphide Antimonide (e.g., $AlPxSb_{1-x}$) that is n-type or p-type doped, or any other suitable III-V compound. The sacrificial layer 420 can have a thickness of approximately 10-200 nm.

In step 330, the first active layer 110A is formed on the sacrificial layer 420. In some embodiments, step 330 is repeated "N" number of times, where "N" is an integer, to form multiple active layers or a thin film multiple junction III-V compound solar cell with "N" junctions or active layers. In step 340, the backing layer 120 is formed on a surface of the last formed active layer that opposes the substrate 400. The result of these steps can be seen in FIG. 4A.

In certain embodiments, the backing layer 120 has a thickness of 10-50 μm, which allows for some flexibility while still providing support. In some embodiments, the backing layer 120 is formed of a polymer. Suitable materials for a polymer layer include, but are not limited to polyimide and KAPTON. In other embodiments, the backing layer 120 is formed of metal. Suitable materials for the backing layer 120 include, but are not limited to, Gold, Copper, Aluminum, Titanium, Platinum, Silver, Tungsten, and other alloys. Those skilled in the art will appreciate that other embodiments may be possible. In some embodiments the backing layer 120 is a compound of metal and polymer.

In step 350, the sacrificial layer 420 is removed from between the first active layer 110A and the substrate 400 by epitaxial lift off to release the thin film III-V compound solar cell 100 from the substrate 400. The stack up of the released thin film III-V compound solar cell 100 is depicted in FIG. 1, before any further processing. In step 355, the substrate 400 may be processed and reused to fabricate another thin film III-V compound solar cell as taught herein.

Figure 4B:
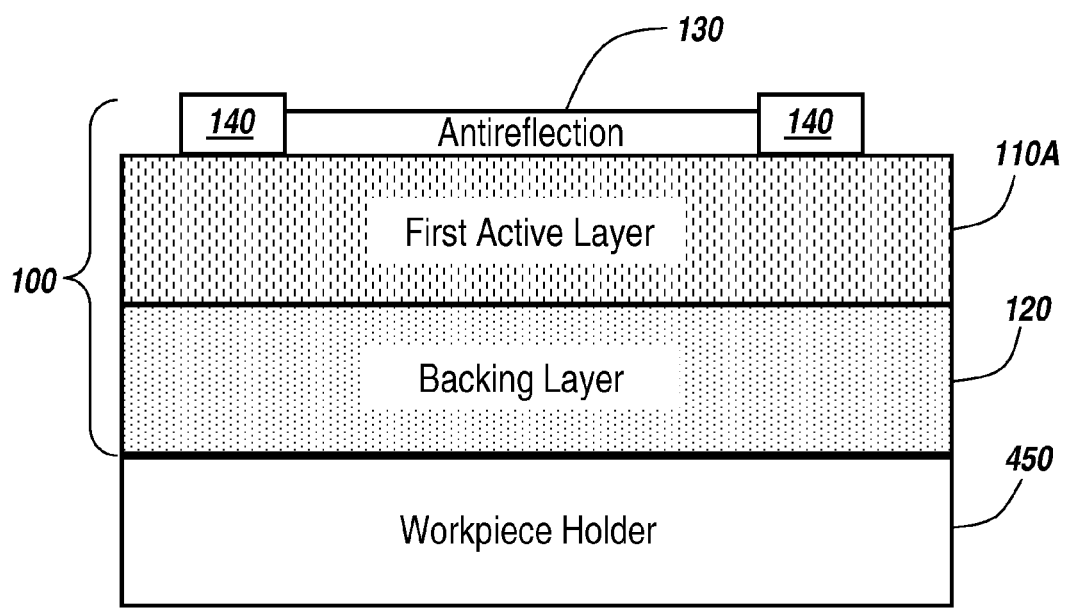
FIG. 4B depicts the thin film III-V solar cell of FIG. 1 after ELO and after further processing in accordance with the teachings of the present invention.

In step 360, the released thin film III-V compound solar cell 100 is inverted and mounted to a workpiece holder 450 for further processing. That is, the backing layer 120 abuts a surface of the workpiece holder 450 to allow further processing of the active layers. FIG. 4B, depicts the thin film III-V compound solar cell 100 mounted to the workpiece holder 450.

In step 380, the last added active layer, for example, the first active layer 110A is processed to form metallized conductors 140. In step 380, the active layers may be etched to remove portions thereof. In step 390, an antireflection coating 130 (for example, a zinc sulfide/magnesium fluoride coating or other suitable antireflection coating) is formed on a surface of the last added active layer opposing the backing layer 120. For example, in FIG. 4B the antireflection coating 130 is formed on the surface of the first active layer 110A opposing the backing layer 120. In some embodiments, additional processing may be performed such as wafer probing, wafer bonding, testing of individual or groups of thin film III-V compound solar cells, slicing of the wafer to produce individual thin film III-V compound solar cells, packaging of the individual thin film III-V compound solar cells, formation of thin film multiple junction III-V compound solar cells and other like processes.

The one or more active layers of the thin film III-V compound solar cells taught herein may be formed of one or more III-V compounds. In certain embodiments, a thin film III-V compound solar cell may have one or more active layers formed of Gallium Arsenide (GaAs), Gallium Indium Phosphide (GaInP), Gallium Indium Arsenide (GaInAs), Gallium Indium Arsenide Phosphide (GaInAsP), Aluminum Gallium Indium Phosphide (AlGaInP), Indium Phosphide (InP) or any suitable III-V compound. In some embodiments, the first active layer 110A is lattice matched to the sacrificial layer 420, lattice matched to the substrate 400 or lattice matched to both the sacrificial layer 420 and the substrate 400. In some embodiments, the first active layer 110A is formed on the sacrificial layer 420 using Metal-Organic Chemical Vapor Deposition (MOCVD). In other embodiments, the first active layer 110A is formed on the sacrificial layer 420 using Molecular Beam Epitaxy (MBE).

As mentioned above, the thin film III-V compound solar cells taught herein may have more than one active layer. That is, the thin film III-V compound solar cells taught herein may be thin film multiple junction III-V compound solar cells. As described herein, each active layer (i.e., junction) in a thin film multiple junction III-V compound solar cell has a different bandgap energy value. FIGS. 5, 6 and 8A-8D depict stack ups of some exemplary thin film multiple junction III-V compound solar cells free of a substrate and formed in accordance with the teachings herein.

Figure 5:
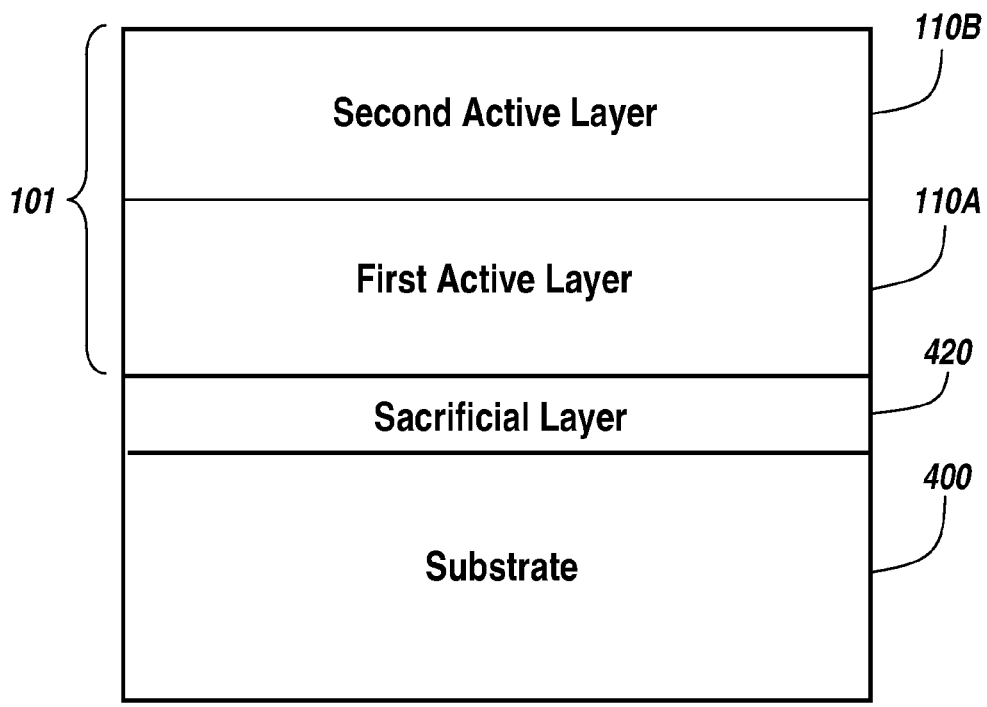
FIG. 5 is a cross-sectional view of one exemplary stack-up of a thin film multiple junction III-V compound solar cell as taught in accordance with the teachings of the present invention.

FIG. 5 depicts one exemplary thin film multiple junction III-V compound solar cell 101 fabricated in accordance with the teachings of the present invention. For illustrative purposes, the thin film multiple junction III-V compound solar cell 101 is depicted prior to deposition of the metal layer and removal of the sacrificial layer 420. As such, the thin film multiple junction III-V compound solar cell 101 can include a metal back layer 120, an antireflection coating 130 and metallized conductors 140 after further processing in accordance with the teachings of the present invention.

The thin film multiple junction solar cell 101 includes a first active layer 110A and a second active layer 110B. As mentioned above, the thin film multiple junction III-V compound solar cell 101 can include a metal back layer 120, an antireflection coating 130 and metallized conductors 140. In one embodiment of the present invention, the first active layer 110A of the thin film multiple junction solar cell 101 may be formed of Gallium Arsenide (GaAs) having a thickness of between about 100 nm and 3000 nm and having a bandgap energy of about 1.42 eV. In one embodiment of the present invention, the second active layer 110B of the thin film multiple junction solar cell 101 is formed of Gallium Indium Phosphide (GaInP) having a thickness of between about 50 nm and 1500 nm and having a bandgap energy of about 1.85 eV.

The exemplary thin film multiple junction III-V compound solar cell 101 may be formed on the sacrificial layer 420. The sacrificial layer 420 for the thin film multiple junction solar cell 101 may be formed of Aluminum Gallium Arsenide ($Al_xGa_{1-x}As$, where x>80%) having a thickness of between about 1 nm and 200 nm and having either a p-type or an n-type doping. The sacrificial layer 420 may be formed on the substrate 400. The substrate 400 on which the exemplary thin film multiple junction III-V compound solar cell 101 is formed and latter removed may be GaAs.

Figure 6:
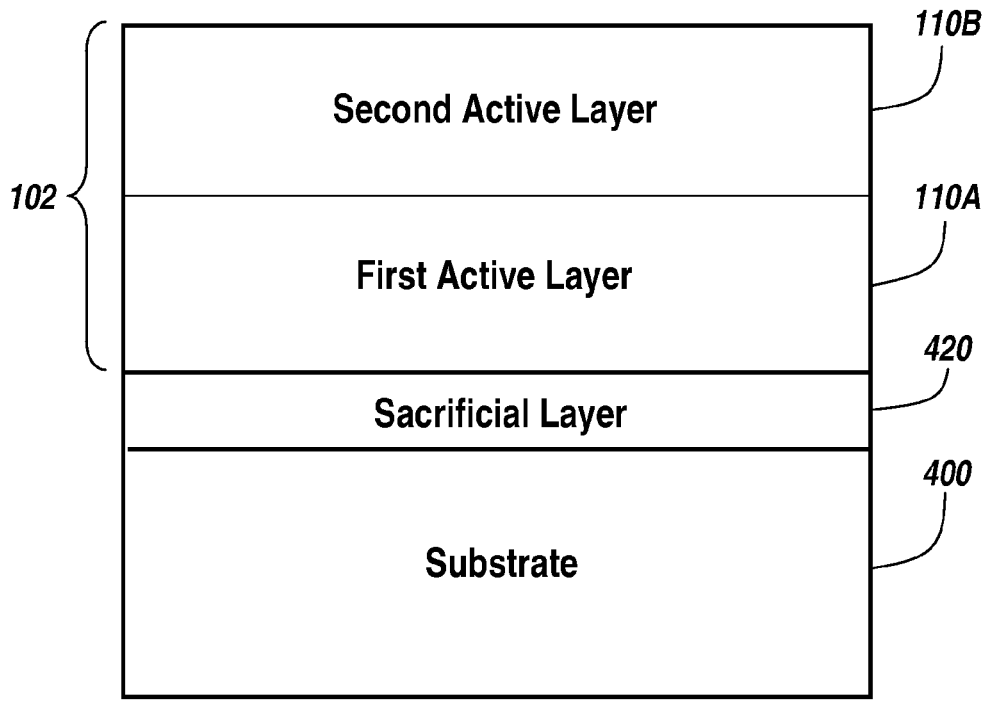
FIG. 6 is a cross-sectional view of another exemplary stack up of a thin film multiple junction III-V compound solar cell as taught in accordance with the teachings of the present invention.

FIG. 6 depicts another exemplary thin film multiple junction III-V compound solar cell 102 fabricated in accordance with the teachings of the present invention. For illustrative purposes, the thin film multiple junction III-V compound solar cell 102 is depicted prior to deposition of the metal layer and removal of the sacrificial layer 420. As such, the thin film multiple junction III-V compound solar cell 102 can include a metal back layer 120, an antireflection coating 130 and metallized conductors 140 after further processing in accordance with the teachings of the present invention.

The thin film multiple junction solar cell 102 includes a first active layer 110A and a second active layer 110B. As mentioned above, the thin film multiple junction III-V compound solar cell 102 can include a metal back layer 120, an antireflection coating 130 and metallized conductors 140. In one embodiment of the present invention, the first active layer 110A of the thin film multiple junction III-V compound solar cell 102 may be formed of Gallium Indium Arsenide (GaInAs) having a thickness of between about 100 nm and 5000 nm. The GaInAs first active layer 110A has a bandgap energy of about 0.75 eV. In one embodiment of the present invention, the second active layer 110B of the thin film multiple junction III-V compound solar cell 102 may be formed of Gallium Indium Arsenide Phosphide (GaInAsP) on the first active layer 110A. The GaInAsP second active layer 110B may have a thickness of between about 100 nm and 5000 nm and have bandgap energy in the range of between about 0.95-1.00 eV.

The exemplary thin film multiple junction III-V compound solar cell 102 may be formed on the sacrificial layer 420. In one embodiment of the present invention, the sacrificial layer 420 on which the thin film multiple junction III-V compound solar cell 102 is formed may be Indium Aluminum Arsenide ($In_{0.52}Al_{0.48}As$) having a thickness of between about 1 nm and 200 nm and having either a p-type or n-type doping. In another embodiment of the present invention, the sacrificial layer 420 on which for the exemplary thin film multiple junction III-V compound solar cell 102 is formed may be Aluminum Arsenide Antimonide ($AlAs_{0.5}Sb_{0.5}$) having a thickness of between about 1 nm and 200 nm and having either a p-type or a n-type doping. The sacrificial layer 420 may be formed on the substrate 400. The substrate 400 for the exemplary thin film multiple junction III-V compound solar cell 102 may be Indium Phosphide (InP).

The first active layer 110A, the second active layer 110B, the sacrificial layer 420 and the substrate 400 of the thin film multiple junction III-V compound solar cell 102 may be formed using Metal-Organic Chemical Vapor Deposition (MOCVD) or Molecular Beam Epitaxy (MBE) as discussed above.

It should be understood that thin film multiple junction III-V compound solar cells having more than two active layers are possible in accordance with the teachings of the present invention. For example, thin film multiple junction III-V compound solar cells having three and four active layers may be formed in accordance with the teachings discussed herein. In some embodiments, multiple layers may be formed one on top of another in accordance with the steps discussed in relation to FIG. 3. In other embodiments, wafer bonding may be used to join multiple independently formed thin film multiple junction III-V compound solar cells, for example, in accordance with the teachings of the present invention, it is possible to wafer-bond the thin film multiple junction III-V compound solar cell 101 and the thin film multiple junction III-V compound solar cell 102 to form a thin film multiple junction III-V compound solar cell having four active layers. An example of wafer bonding is discussed in relation to FIG. 7.

Figure 7:
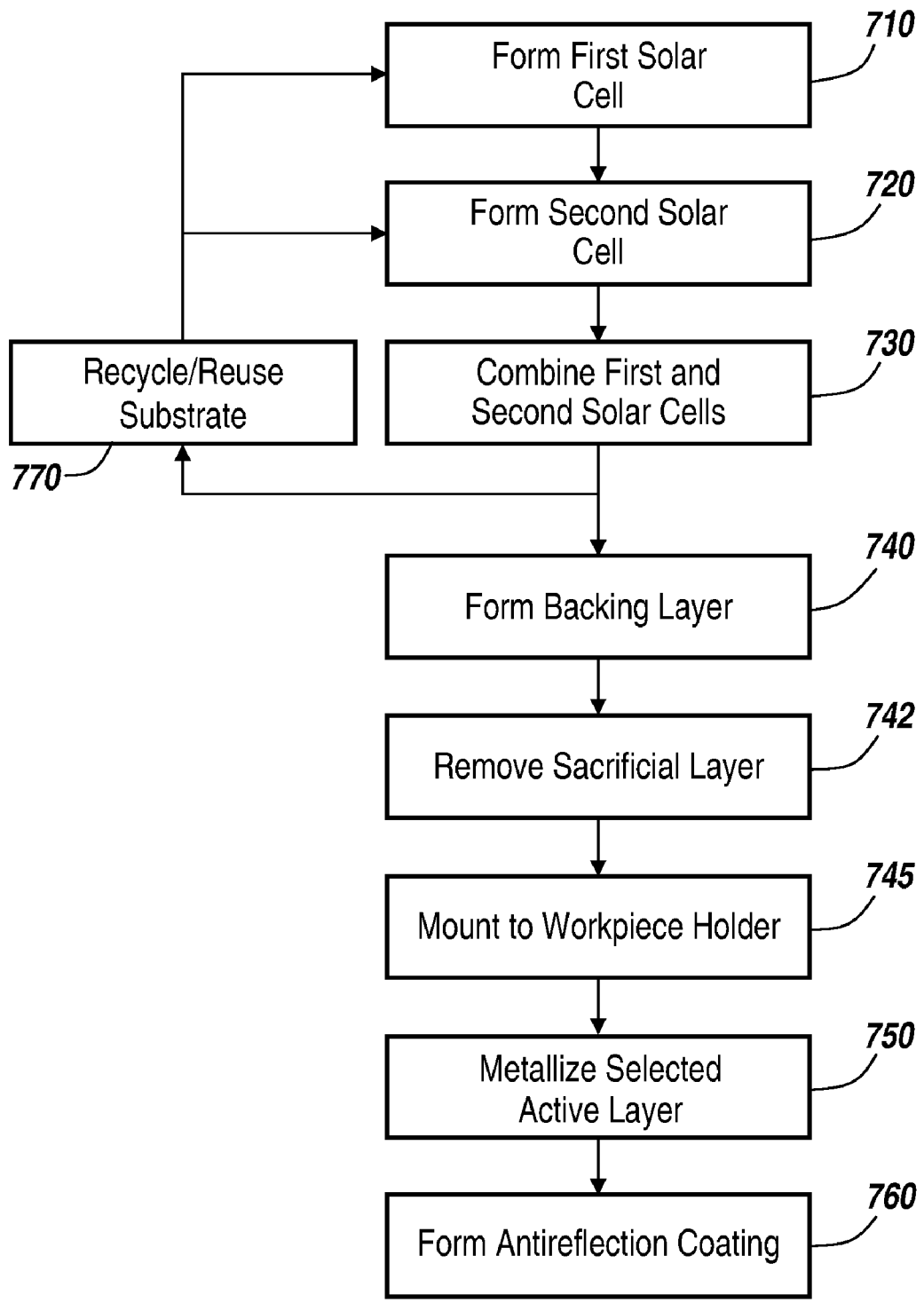
FIG. 7 is an exemplary flow diagram depicting steps taken to fabricate a thin film multiple junction III-V compound solar cell using epitaxial lift-off (ELO) in accordance with the teachings of the present invention.

FIG. 7 is a block flow diagram depicting formation of a thin film III-V compound multiple junction solar cell from other independently formed thin film III-V compound multiple junction solar cells, for example, the thin film III-V compound multiple junction solar cells depicted in FIGS. 5 and 6. FIGS. 8A-8D depict exemplary stack ups of wafer bonded thin film multiple junction III-V compound solar cells formed according to the block flow diagram of FIG. 7.

In step 710, a first thin film III-V compound solar cell is formed. The first thin film III-V compound solar cell may be a single junction solar cell, for example, the thin film III-V compound solar cell 100 or may be a multiple junction solar cell, for example, the thin film multiple junction III-V solar cell 101 or the thin film multiple junction III-V solar cell 102. Those skilled in the art will appreciate that other thin film III-V compound solar cell structures are possible in addition to those discussed in relation to FIGS. 1, 5 and 6. The first thin film III-V compound solar cell may be formed in accordance with steps 310-350 depicted in FIG. 3.

Depending on the final stack up arrangement of the wafer bonded thin film III-V compound solar cell, step 340 may be skipped or bypassed during formation of the first thin film III-V compound solar cell. The reason for skipping or bypassing step 340 is because the formation of the backing layer 120 would interfere with the wafer bonding process that takes place in step 730 below.

Likewise, depending on the final stack up arrangement of the wafer bonded thin film III-V compound solar cell, step 350 may be skipped or bypassed during formation of the first thin film III-V compound solar cell. The sacrificial layer may be removed in step 742 once the first thin film III-V compound solar cell and a second thin film III-V compound solar cell are wafer bonded.

In step 720, a second thin film III-V compound solar cell is formed. The second thin film III-V compound solar cell may be a single junction solar cell, for example, the thin film III-V compound solar cell 100 or may be a multiple junction solar cell, for example, the thin film multiple junction III-V solar cell 101 or the thin film multiple junction III-V solar cell 102. Those skilled in the art will appreciate that other thin film III-V compound solar cell structures are possible in addition to those discussed in relation to FIGS. 1, 5 and 6. The second thin film III-V compound solar cell may be formed in accordance with steps 310-350 depicted in FIG. 3.

Depending on the final stack up arraignment of the wafer bonded thin film III-V compound solar cell, step 340 may be skipped or bypassed during formation of the second thin film III-V compound solar cell. The reason for skipping or bypassing step 340 is because the formation of the backing layer 120 would interfere with the wafer bonding process that takes place in step 730 below.

Likewise, depending on the final stack up arraignment of the wafer bonded thin film III-V compound solar cell, step 350 may be skipped or bypassed during formation of the second thin film III-V compound solar cell. The sacrificial layer may be removed in step 742 once the first thin film III-V compound solar cell and the second thin film III-V compound solar cell are wafer bonded.

Those skilled in the art will appreciate that steps 710 and 720 may be carried out in parallel fashion or in serial fashion.

In step 730, the first and second thin film III-V compound solar cells are wafer bonded to form a wafer bonded thin film multiple junction III-V compound solar cell 103. In one embodiment, the first and second thin film III-V compound solar cells are wafer bonded to form the wafer bonded thin film multiple junction III-V compound solar cell 103. In step 730 or before step 730, either the first thin film III-V compound solar cell or the second thin film III-V compound solar cell may undergo formation of the backing layer 120 in step 340 and, in turn, an epitaxial lift off process as in step 350 to remove the sacrificial layer 420. In turn, the lifted off thin film III-V compound solar cell with the backing layer 120 is wafer bonded to a surface of an active layer of the other thin film III-V solar cell, which is affixed to the substrate 400.

The wafer bonding may employ a direct wafer bonding methodology that is accomplished by placing one wafer over the other and heating the combined stack to high temperatures (e.g., temperatures >300° C.) under uniformly applied high pressure. The wafer bonding methodology may also involve wafer surface preparation such as cleaning and removal of large particles on the surface. Atomically flat surfaces are needed for wafer bonding. Smoothing of the surfaces can be achieved either by polishing or by chemical etching. In some embodiments of the present invention, a bonding layer is employed between the two surfaces being bonded. In some embodiments, no bonding layer is employed between the two surfaces being bonded.

Figure 8A:
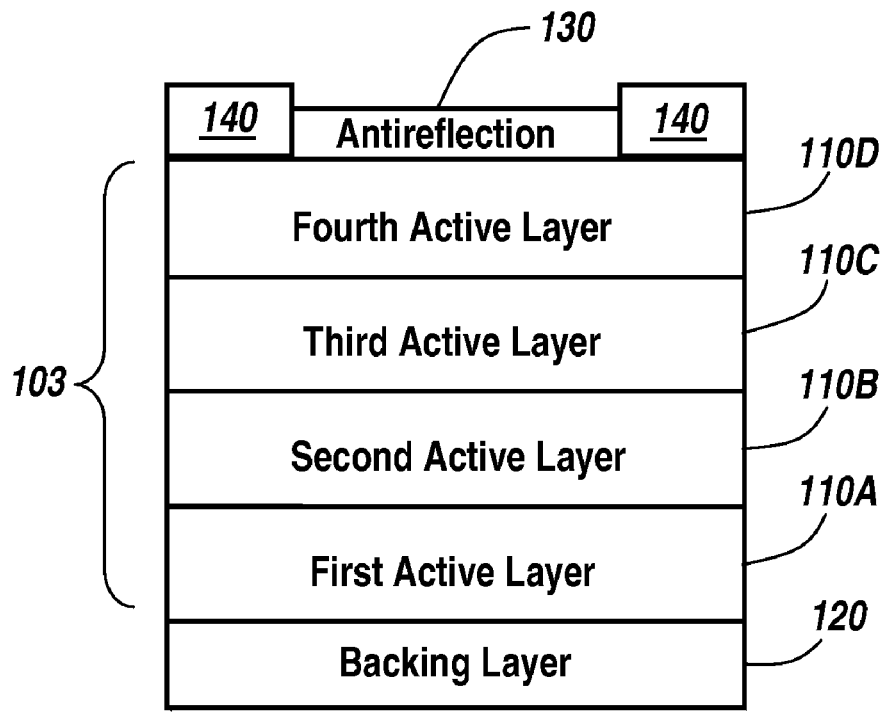
FIG. 8A is a cross-sectional view of another exemplary stack up of a wafer bonded thin film multiple junction III-V compound solar cell as taught in accordance with the teachings of the present invention.

One example of a wafer bonded thin film multiple junction III-V compound solar cell 103 is depicted in FIG. 8A. The wafer bonded thin film multiple junction III-V compound solar cell 103 includes a first active layer 110A, a second active layer 110B, a third active layer 110C and a fourth active layer 110D. In one embodiment of the present invention, the first active layer 110A of the wafer bonded thin film multiple junction III-V compound solar cell 103 is formed of Gallium Indium Arsenide (GaInAs) having a thickness of between about 100 nm and 5000 nm and having a bandgap energy of about 0.75 eV; the second active layer 110B of the wafer bonded thin film multiple junction III-V compound solar cell 103 is formed of Gallium Indium Arsenide Phosphide (GaInAsP) having a thickness of between about 100 nm and 3000 nm and having a bandgap energy of between about 0.95-1.00 eV; the third active layer 110C of the wafer bonded thin film multiple junction III-V compound solar cell 103 is formed of Gallium Arsenide (GaAs) having a thickness of between about 100 nm and 3000 nm and having a bandgap energy of about 1.42 eV; and the fourth active layer 110D of the wafer bonded thin film multiple junction III-V compound solar cell 103 is formed of Gallium Indium Phosphide (GaInP) having a thickness of between about 100 nm and 2000 nm and having a bandgap energy of about 1.85 eV. Those skilled in the art will appreciate that the epitaxial stack up described above is merely exemplary and that the epitaxial stack up depicted in FIG. 8A is not limited to four active layers or junctions, but may include fewer active layers or junctions, for example, two or three active layers or junctions. In like manner, the epitaxial stack up depicted in FIG. 8A is not limited to four active layers or junctions, but may include more active layers or junctions, for example, five, six, seven or more active layers or junctions.

Figure 8B:
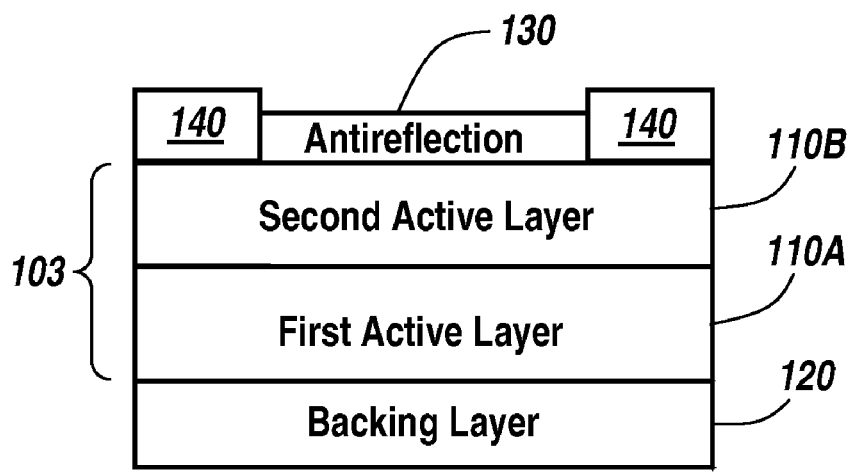
FIG. 8B is a cross-sectional view of another exemplary stack up of a wafer bonded thin film multiple junction III-V compound solar cell as taught in accordance with the teachings of the present invention.
Figure 8C:
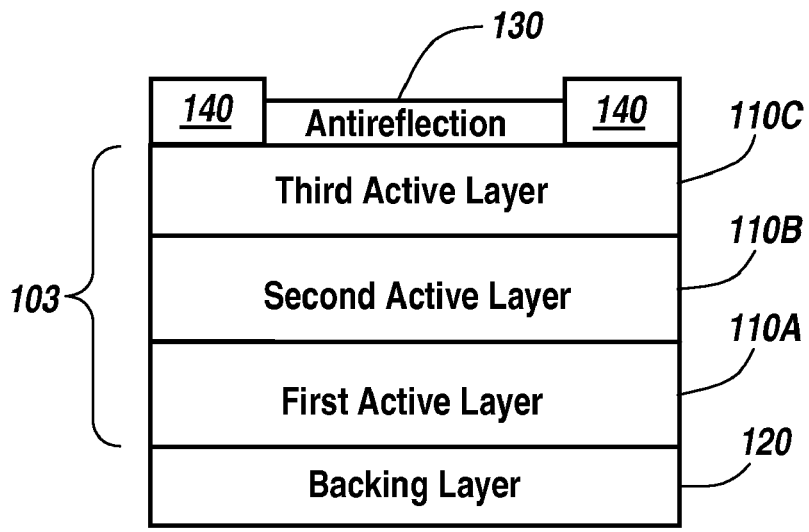
FIG. 8C is a cross-sectional view of another exemplary stack up of a wafer bonded thin film multiple junction III-V compound solar cell as taught in accordance with the teachings of the present invention.
Figure 8D:
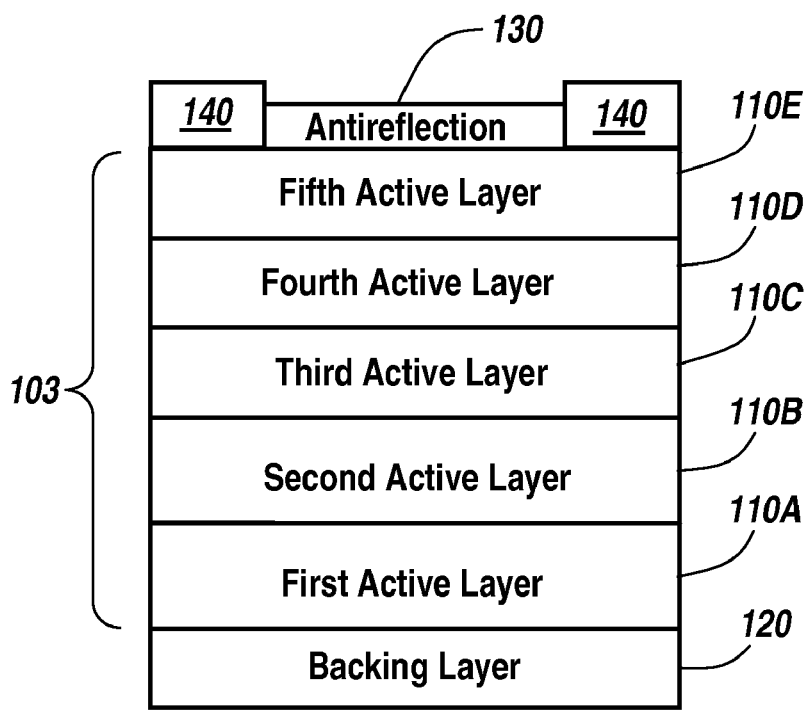
FIG. 8D is a cross-sectional view of another exemplary stack up of a wafer bonded thin film multiple junction III-V compound solar cell as taught in accordance with the teachings of the present invention.

Other examples of a wafer bonded thin film multiple junction III-V compound solar cell 103 are depicted in FIGS. 8B-8D. FIG. 8B depicts the wafer bonded thin film multiple junction III-V compound solar cell 103 with two active layers 110A and 110B. FIG. 8C depicts the wafer bonded thin film multiple junction III-V compound solar cell 103 with three active layers 110A, 110B and 110C. FIG. 8D depicts the wafer bonded thin film multiple junction III-V compound solar cell 103 with five active layers 110A, 110B, 110C, 110D and 110E. As mentioned above, the wafer bonded thin film multiple junction III-V compound solar cell 103 is not limited to any particular number of active layers and is not limited to any particular III-V compound stack up or structure.

In some embodiments, the backing layer 120 is formed after the first and second III-V compound solar cells are wafer bonded. Thus, some embodiments include a step 740. In step 740, the backing layer 120 is formed on the wafer bonded thin film multiple junction III-V compound solar cell 100D. As mentioned above, the backing layer 120 may also be formed earlier in the process of forming a wafer bonded thin film multiple junction III-V compound solar cell, for example, in step 340 on either the first thin film III-V compound solar cell or the second thin film III-V compound solar cell, but not both. Formation of the backing layer 120 is performed on the active layer or junction having the lowest bandgap energy from amongst the multiple active layers or junctions of the wafer bonded thin film multiple junction III-V compound solar cell 100D. If formation of the backing layer occurs before or as part of wafer bonding in step 730, the thin film III-V compound solar cell having the backing layer 120 formed thereon would be removed from the substrate on which it was formed by the epitaxial lift off process of step 340. The lifted off thin film III-V compound solar cell would be wafer bonded to the other thin film III-V compound solar cell.

In certain embodiments, the backing layer 120 has a thickness of 10-50 μm, which allows for some flexibility while still providing support. In some embodiments, the backing layer 120 is formed of a polymer. Suitable materials for a polymer layer include, but are not limited to polyimide and KAPTON. In other embodiments, the backing layer 120 is formed of metal. Suitable materials for the backing layer 120 include, but are not limited to, Gold, Copper, Aluminum, Titanium, Platinum, Silver, Tungsten, and other alloys. Those skilled in the art will appreciate that other embodiments may be possible. In some embodiments the backing layer 120 is a compound of metal and polymer.

The backing layer 120 may be formed on the active layer having the lowest bandgap energy level by plating, evaporation, sputtering, spin coating, or screen-printing. Plating is done either by electrodeposition or electrode less deposition. Formation of the backing layer 120 on the selected active layer having the lowest bandgap energy level assists in increasing the efficiency of a thin film multiple junction III-V compound solar cell of the present invention by recycling photons that are not fully absorbed in the overlying layers via reflection. Additionally, the backing layer 120 provides structural support, thermal dissipation and transfer for the thin film multiple junction III-V compound solar cells of the present invention.

In step 742, the remaining sacrificial layer or layers are removed in the manner of step 350. Those skilled in the art will appreciate that if the wafer bonding had taken place without ELO being performed on one of the thin film multiple junction III-V compound solar cells, that the sacrificial layers would be removed in sequence. After the removal of the first sacrificial layer, a backing layer would be applied to the surface from which the substrate had been removed.

In step 745, the wafer bonded thin film multiple junction III-V compound solar cell 100D is mounted to a workpiece holder for further processing.

In step 750, a surface the active layer having the highest bandgap energy is metallized to form at least metallized conductors 140. The metallized conductors 140 may be bus bars or other conductors for interconnecting two or more wafer bonded thin film multiple junction III-V compound solar cells.

In step 760, an antireflection coating 130 is applied to a surface of the active layer having the highest bandgap energy level of the wafer bonded thin film multiple junction III-V compound solar cell 100D.

When the sacrificial layer 420 is removed, the first active layer 110A or layers, for example, any of the active layers 110A-110D, are separated from the substrate 400. This lift off and removal of the sacrificial layer 420 is referred to as epitaxial lift-off (ELO). In certain embodiments, the removal of the sacrificial layer 420 is performed by etching. In such embodiments, this may involve immersing the substrate 400, sacrificial layer 420, the various active layers 110A-110D and the backing support layer 120 in an acid etch solution to dissolve the sacrificial layer 420. The type of acid etch solution depends on the materials used in the substrate 400, the sacrificial layer 420, the active layers 110A-110D and the backing layer 120. An example of a suitable acid etch solution is a solution of approximately 10-25% Hydrofluoric Acid at 50° C. One skilled in the art will appreciate that other suitable etch solutions and methods are possible.

One of the advantages of the present invention is that wafer scale epitaxial lift-off (ELO) is possible. The backing layer 120 provides the flexibility to be able to separate and handle individual thin film III-V compound solar cells and a full or partial wafer of thin film III-V solar cells free of a substrate. A thin film III-V compound solar cell formed by using the epitaxial lift-off methodology described herein has performance characteristics similar to conventional solar cells that are affixed to substrates. Advantageously, the thin film III-V compound solar cells as taught herein do not suffer from the drawbacks suffered by such conventional solar cells affixed to a substrate.

Figure 9:
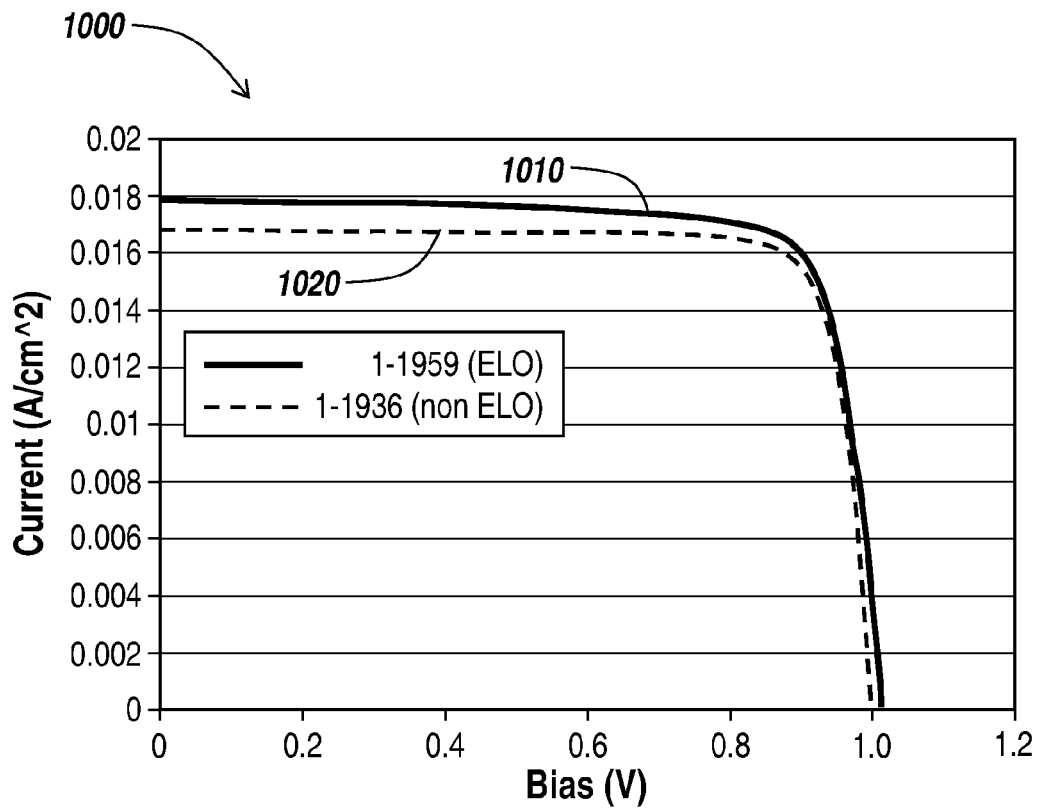
FIG. 9 is a graph graphically depicting a comparison of the Current v. Bias characteristics of a thin film III-V compound solar cell fabricated in accordance with the teachings herein and a conventionally fabricated III-V compound solar cell having a substrate attached thereto.

FIG. 9 graphically depicts a comparison of Current v. Bias (IV) curves for a thin film single junction Gallium Arsenide (GaAs) solar cell manufactured using the epitaxial lift-off method (ELO) disclosed herein and a conventional single junction Gallium Arsenide (GaAs) solar cell affixed to a substrate. The graph 1000 depicts the IV characteristics for the thin film single junction GaAs solar cell formed in accordance with the teachings herein with plot 1010. In similar fashion, the graph 1000 depicts the IV characteristics for the single junction GaAs solar cell affixed to the substrate with plot 1020. Comparison of the IV plot 1010 and the IV plot 1020 shows that there is no degradation in the IV characteristics of the thin film single junction GaAs solar cell formed in accordance with the teachings herein. Rather, the thin film single junction GaAs solar cell formed in accordance with the teachings herein exhibits improved IV performance characteristics.

Solar cells manufactured using the ELO methods of the present invention are also quite robust against thermal shock. To test this, solar cells fabricated using the ELO method taught in the present invention was thermally shocked using liquid nitrogen (LN2).

Figure 10:
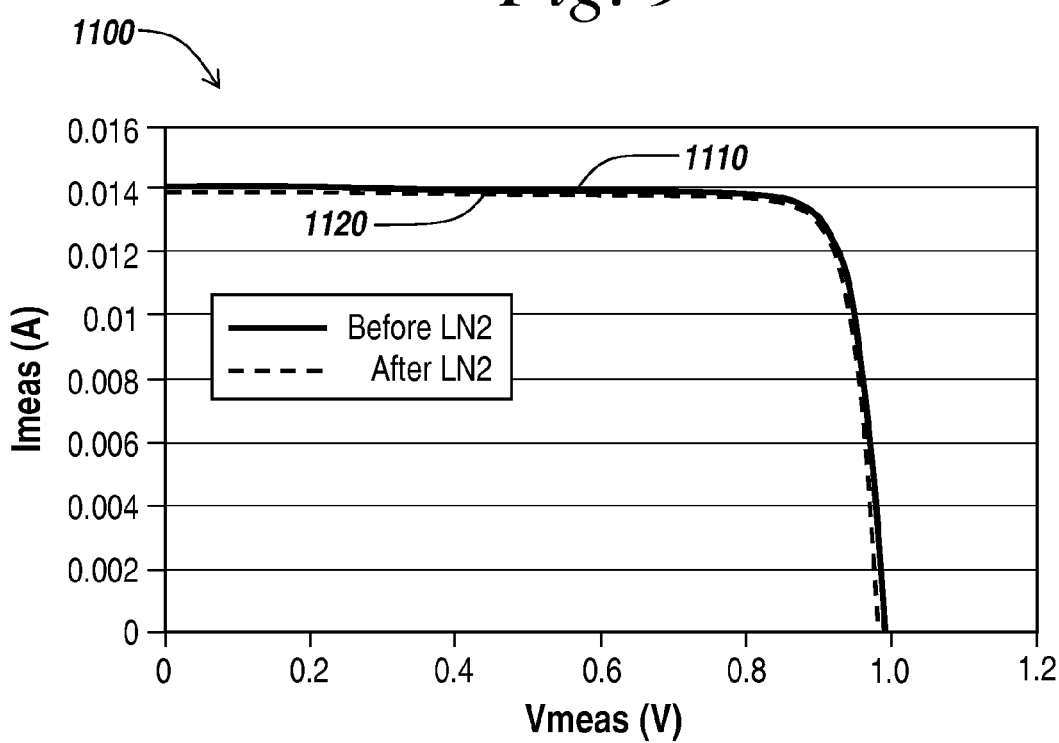
FIG. 10 is graph graphically depicting the Current v. Bias characteristics of a thin film III-V compound solar cell fabricated in accordance with the teachings herein before and after temperature cycling.

FIG. 10 graphically depicts the measured IV performance characteristics of a thin film III-V compound solar cell formed in accordance with the teachings herein before and after the LN2 cycling. Plot 1120 depicts the measured IV performance characteristics of the thin film III-V compound solar cell formed in accordance with the teachings herein before the LN2 cycling. Plot 1110 depicts the measured IV performance characteristics of the thin film III-V compound solar cell formed in accordance with the teachings herein after the LN2 cycling. A review of the before and after IV performance characteristics show no apparent differences in the IV curves. This suggests that the thin film III-V solar cells formed in accordance with the teachings herein are robust and not susceptible to damage by the thermal shock.

Figure 11:
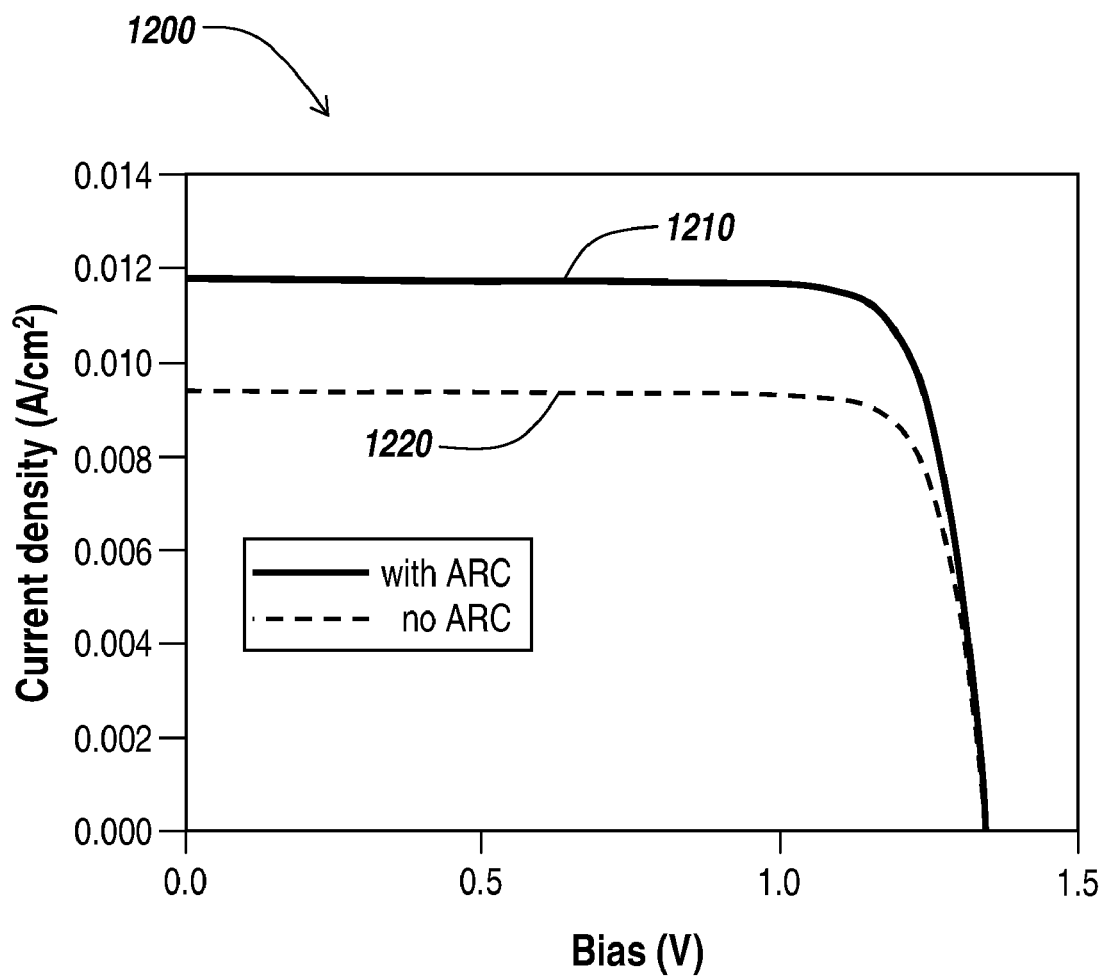
FIG. 11 is graph graphically depicting the Current v. Bias characteristics of a thin film III-V compound solar cell with and without an antireflection coating formed thereon as fabricated in accordance with the teachings of the present invention.

FIG. 11 graphically depicts Current v. Bias (IV) performance characteristics from a thin film Gallium Indium Phosphide (GaInP) single junction solar cell formed in accordance with the teachings herein. The IV performance characteristics graphically depicted in FIG. 11 includes a first plot 1210 depicting the measured IV performance characteristics of the GaInP single junction solar cell with the antireflection coating 130. FIG. 11 includes a second plot 1220 depicting the measured IV performance characteristics of the GaInP single junction solar cell without the antireflection coating 130. After the antireflection coating 130 was applied, the following performance characteristics were measured: Voc=1.35 V, Isc=11.7 mA/cm$^2$, FF=81% and efficiency=13.0%.

As graphically depicted in the various graphs, the thin film III-V solar cell fabrication methodology disclosed herein is not limited to one III-V compound, but rather is well suited for use with a variety of III-V compounds to form thin film III-V compound solar cells free of a substrate.

Thus using the ELO methodology as taught by the present invention it is possible to create a thin film III-V compound solar cell that performs as well, if not better than, solar cells created using conventional methods and without requiring the thin film III-V compound solar cell to remain affixed to the substrate after fabrication. An additional benefit is that the removed substrate can then be reused to form another thin film III-V compound solar cell. By using the ELO method of the present invention, the resulting thin film III-V compound solar cells are lighter, less wasteful and more flexible than those produced using conventional methods.

Numerous modifications and alternative embodiments of the present invention will be apparent to those skilled in the art in view of the foregoing description. Accordingly, this description is to be construed as illustrative only and is for the purpose of teaching those skilled in the art the best mode for carrying out the present invention. Details of the structure may vary substantially without departing from the spirit of the present invention, and exclusive use of all modifications that come within the scope of the appended claims is reserved. It is intended that the present invention be limited only to the extent required by the appended claims and the applicable rules of law.

It is also to be understood that the following claims are to cover all generic and specific features of the invention described herein, and all statements of the scope of the invention that, as a matter of language, might be said to fall therebetween.

The invention claimed is:

1. A method for forming a thin film multiple junction III-V compound solar cell, the method comprising:
   forming a first thin film III-V compound solar cell on a first substrate,
   forming a second thin film III-V compound solar cell on a second substrate, lifting by epitaxial lift off one of the first thin film III-V compound solar cell from the first substrate or the second thin film III-V compound solar cell from the second substrate, wafer bonding the first and the second thin film III-V compound solar cell to form a wafer bonded thin film multiple junction III-V compound solar cell, wherein the wafer bonding includes direct wafer to wafer contact, and lifting by epitaxial lift off the wafer bonded thin film III-V compound solar cell from the remaining substrate.

2. The method of claim 1 further comprising, forming a backing layer on a surface of the wafer bonded thin film multiple junction III-V compound solar cell.

3. The method of claim 2, wherein the backing layer is formed on the surface of the wafer bonded thin film multiple junction III-V compound solar cell having the lowest bandgap energy level.

4. The method of claim 1 further comprising, metallizing a surface of the wafer bonded thin film multiple junction III-V compound solar cell to form one or more metallized conductive paths.

5. The method of claim 4, wherein the surface of the wafer bonded thin film multiple junction III-V compound solar cell having the highest bandgap energy is metallized with a grid of metallized conductors.

6. The method of claim 1 further comprising, forming an antireflection coating a surface of the wafer bonded thin film multiple junction III-V compound solar cell.

7. The method of claim 6, wherein the antireflection coating is formed on the surface of the junction having the highest bandgap energy in the wafer bonded thin film multiple junction III-V compound solar.

8. A method for forming a thin film multiple junction III-V compound solar cell, the method comprising:

forming a first thin film III-V compound solar cell on a first substrate having at least one active layer, forming a second thin film III-V compound solar cell on a second substrate having at least one active layer, wafer bonding the first and the second thin film III-V compound solar cell to form a wafer bonded thin film multiple junction III-V compound solar cell, wherein the wafer bonding includes direct wafer to wafer contact, removing a sacrificial layer from between the wafer bonded thin film multiple junction III-V compound solar cell and either the first substrate or the second substrate, and lifting by epitaxial lift off the wafer bonded thin film III-V compound solar cell from the remaining substrate.

* * * * *

UNITED STATES PATENT AND TRADEMARK OFFICE
CERTIFICATE OF CORRECTION

PATENT NO. : 7,994,419 B2  Page 1 of 1
APPLICATION NO. : 12/167583
DATED : August 9, 2011
INVENTOR(S) : Noren Pan et al.

It is certified that error appears in the above-identified patent and that said Letters Patent is hereby corrected as shown below:

In the Specification:

At column 1, line 15, after "No. NAT-7-77015-05." and before "The U.S. Government", insert --Some of the work described herein was sponsored by the Air Force Research Laboratory (AFRL), Contract No. FA9453-09-C-0372.--

Signed and Sealed this
Fourth Day of March, 2014

Michelle K. Lee
*Deputy Director of the United States Patent and Trademark Office*

UNITED STATES PATENT AND TRADEMARK OFFICE
CERTIFICATE OF CORRECTION

PATENT NO. : 7,994,419 B2
APPLICATION NO. : 12/167583
DATED : August 9, 2011
INVENTOR(S) : Noren Pan et al.

It is certified that error appears in the above-identified patent and that said Letters Patent is hereby corrected as shown below:

In the Specification:

In specification at column 1, line 13, replace "Some of the work described herein was sponsored by the National Renewable Energy Laboratory (NREL), Contract No. NAT-7-77015-05." by "This invention was made with Government support under Contract No. FA9453-09-C-0372 awarded by Air Force Research Laboratory and Contract No. NAT-7-77015-05 awarded by National Renewable Energy Laboratory."

Signed and Sealed this
Twenty-fifth Day of November, 2014

Michelle K. Lee
*Deputy Director of the United States Patent and Trademark Office*